(12) United States Patent
Bonderson et al.

(10) Patent No.: US 8,275,428 B2
(45) Date of Patent: Sep. 25, 2012

(54) METHOD FOR PLANAR IMPLEMENTATION OF π/8 GATE IN CHIRAL TOPOLOGICAL SUPERCONDUCTORS

(75) Inventors: Parsa Bonderson, Santa Barbara, CA (US); Michael Freedman, Santa Barbara, CA (US); Chetan Nayak, Santa Barbara, CA (US); Kevin Walker, Santa Barbara, CA (US); Lukasz Fidkowski, Goleta, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/077,339

(22) Filed: Mar. 31, 2011

(65) Prior Publication Data

US 2011/0287941 A1 Nov. 24, 2011

Related U.S. Application Data

(60) Provisional application No. 61/347,022, filed on May 21, 2010.

(51) Int. Cl.
*H01L 39/10* (2006.01)
*H01L 39/24* (2006.01)

(52) U.S. Cl. .................................................. 505/182
(58) Field of Classification Search .............. 505/182, 505/500; 356/450–521
See application file for complete search history.

(56) References Cited

U.S. PATENT DOCUMENTS

| 5,130,766 | A | 7/1992 | Arimoto et al. |
| 6,459,097 | B1 * | 10/2002 | Zagoskin ................ 257/31 |
| 7,453,162 | B2 | 11/2008 | Freedman et al. |
| 2009/0079421 | A1 | 3/2009 | Freedman et al. |
| 2010/0264402 | A1 | 10/2010 | Bonderson et al. |
| 2010/0264910 | A1 | 10/2010 | Bonderson |

OTHER PUBLICATIONS

Bonderson et al., "A Blueprint for a Topologically Fault-tolerant Quantum Computer", Mar. 15, 2010, 1-6.
Clarke et al., "Improved phase gate reliability in systems with neutral Ising anyons", Sep. 1, 2010, 1-5.
van Meter et al., "Distributed Quantum Computation Architecture Using Semiconductor Nanophotonics", Sep. 17, 2009, 1-29.
"International Search Report", Mailed Date: Feb. 17, 2012, Application No. PCT/US2011/037430, Filed Date: May 20, 2011, pp. 9.
Sau, et al., "A Generic New Platform for Topological Quantum Computation using Semiconductor Heterostructures", Retrieved at <<arxiv.org/pdf/0907.2239>>, Physical Review Letters, The American Physical Society, Jan. 27, 2010, pp. 1-4.
Akhmerov, et al., "Electrically Detected Interferometry of Majorana Fermions in a Tological Insulator", Retrieved at <<arxiv.org/pdf/0903.2196>>, Physical Review Letters, The American Physical Society, May 28, 2009, pp. 1-4.

* cited by examiner

*Primary Examiner* — Colleen Dunn
(74) *Attorney, Agent, or Firm* — Condo Roccia LLP (57) ABSTRACT

Disclosed herein is a topologically protected π/8-gate which becomes universal when combined with the gates available through quasi-particle braiding and planar quasi-particle interferometry. A twisted interferometer, and a planar π/8-gate in CTS, implemented with the help of the twisted interferometer, are disclosed. Embodiments are described in the context of state X (CTS) supported by an ISH, although the concept of a twisted-interferometer is more general and has relevance to all anionic, i.e. quasiparticle systems.

20 Claims, 11 Drawing Sheets

METHOD FOR PLANAR IMPLEMENTATION OF π/8 GATE IN CHIRAL TOPOLOGICAL SUPERCONDUCTORS

CROSS-REFERENCE TO RELATED APPLICATIONS

This application claims benefit under 35 U.S.C. §119(e) of provisional U.S. patent application No. 61/347,022, filed May 21, 2010, the disclosure of which is hereby incorporated herein by reference.

TECHNICAL FIELD

The subject matter disclosed and claimed herein relates generally to the field of quantum computing. Specifically, the subject matter disclosed and claimed herein relates to methods for planar implementation of the π/8 gate in chiral topological superconductors.

BACKGROUND

The term chiral topological superconductor (CTS) may be used to describe any 2D-system based on a spin-orbit coupled semiconductor with superconductivity imported via proximity effect, as well as any other Ising-like system with the topological properties listed below. Examples include Sau et al. (arxiv:0907,2239), Alicea (arxiv:0912.2115), and Qi et al. (arxiv: 1003.5448), the disclosures of which are incorporated herein by reference. Such systems are topological superconductors and support localized Majorana states. These CTS are not purely topological, additionally supporting a classical order parameter $\phi$. If the CTS is not planar, but configured as a surface of genus>0, a significant stiffness term $\rho|\nabla\phi|^2$ in the Lagrangian will prevent superposition of certain topological states. For this reason it is desirable to devise a protocol for executing a computationally universal set of gates in a strictly planar context.

Previously, the term Ising sandwich heterostructure (ISH) has been used for this concept. But, since it is hoped that an ISH may be built without an effective order parameter $\phi$, the term CTS is used herein to emphasize the presence of the order parameter.

SUMMARY

Disclosed herein is a topologically protected $$\frac{\pi}{8} - \text{gate} \equiv \begin{vmatrix} e^{i\frac{\pi}{8}} & 0 \\ 0 & e^{-i\frac{\pi}{8}} \end{vmatrix}$$

which becomes universal when combined with the gates available through quasi-particle braiding and previously described planar quasi-particle interferometry:

$$P = \begin{vmatrix} 1 & 0 \\ 0 & i \end{vmatrix}, H\frac{1}{\sqrt{2}}\begin{vmatrix} 1 & 1 \\ 1 & -1 \end{vmatrix}, \text{ and } CNOT\begin{vmatrix} 1 & 0 & 0 & 0 \\ 0 & 1 & 0 & 0 \\ 0 & 0 & 0 & 1 \\ 0 & 0 & 1 & 0 \end{vmatrix}.$$

Key features of the Ising topological structure underlying CTS quasi-particle excitation include:

Excitations I, $\sigma$, $\psi$ (trivial, twist, fermion),
Nontrivial fusions $\sigma \otimes \sigma = 1 + \psi$ and $\psi \otimes \psi = 1$, $$S - \text{matrix}: \begin{vmatrix} \frac{1}{2} & \frac{\sqrt{2}}{2} & \frac{1}{2} \\ \frac{\sqrt{2}}{2} & 0 & -\frac{\sqrt{2}}{2} \\ \frac{1}{2} & -\frac{\sqrt{2}}{2} & \frac{1}{2} \end{vmatrix},$$

$$\text{Twist-matrix}: \begin{vmatrix} 1 & 0 & 0 \\ 0 & e^{\frac{2\pi i}{16}} & 0 \\ 0 & 0 & 1 \end{vmatrix}, \text{ and }$$

$$\text{spin}(\sigma) = e^{\frac{2\pi i}{16}}$$

Figure 1A:
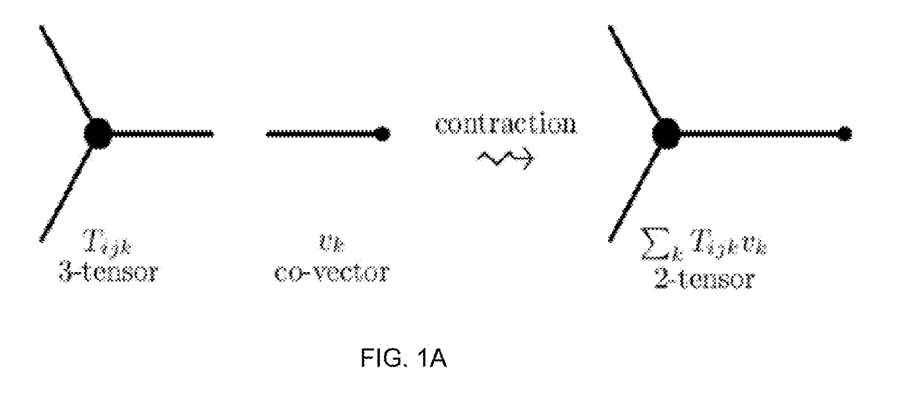
FIGS. 1A and 1B illustrate tensor contraction in Penrose notation.
Figure 1B:
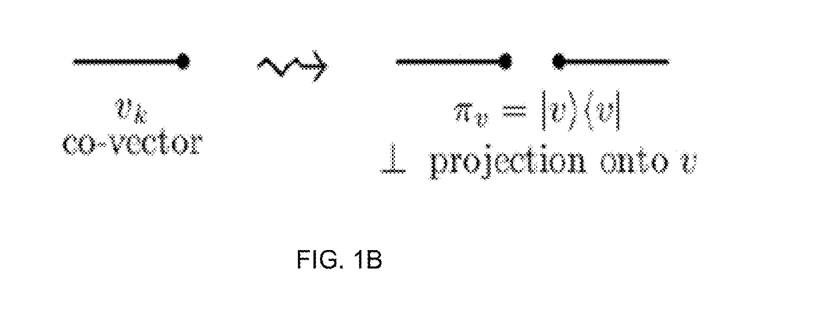

To explicate the disclosed methods, the concept of quantum mechanical measurement may be connected to topology change in (2+1)-dimensional TQFTs. First, tensor contraction may be illustrated, in Penrose notation [P], with a 3-tensor, as shown in FIGS. 1A and 1B.

A measurement operator O with possible outcome vectors $v^1, \ldots, v^n$ can be written as $$O = x \sum_{l=1}^{n} |v^l\rangle \langle v^l | \bar{v}^l|,$$

where $\bar{v}^l$ is the detector state corresponding to outcome $v^l$. Measurement can be applied not just to a vector w but to a tensor T (corresponding to a segregation of quantum information into disjoint systems) in which case becomes $$w \mapsto wO = \sum_{l=1}^{n} \langle w | v^l \rangle \langle v^l | |\bar{v}^l\rangle$$

becomes $$T \mapsto TcontractO == \sum_{l=1}^{n} \left( \sum_{k} T_{ijk} v_k^l \right) \otimes |\bar{v}^l\rangle.$$

Figure 2:
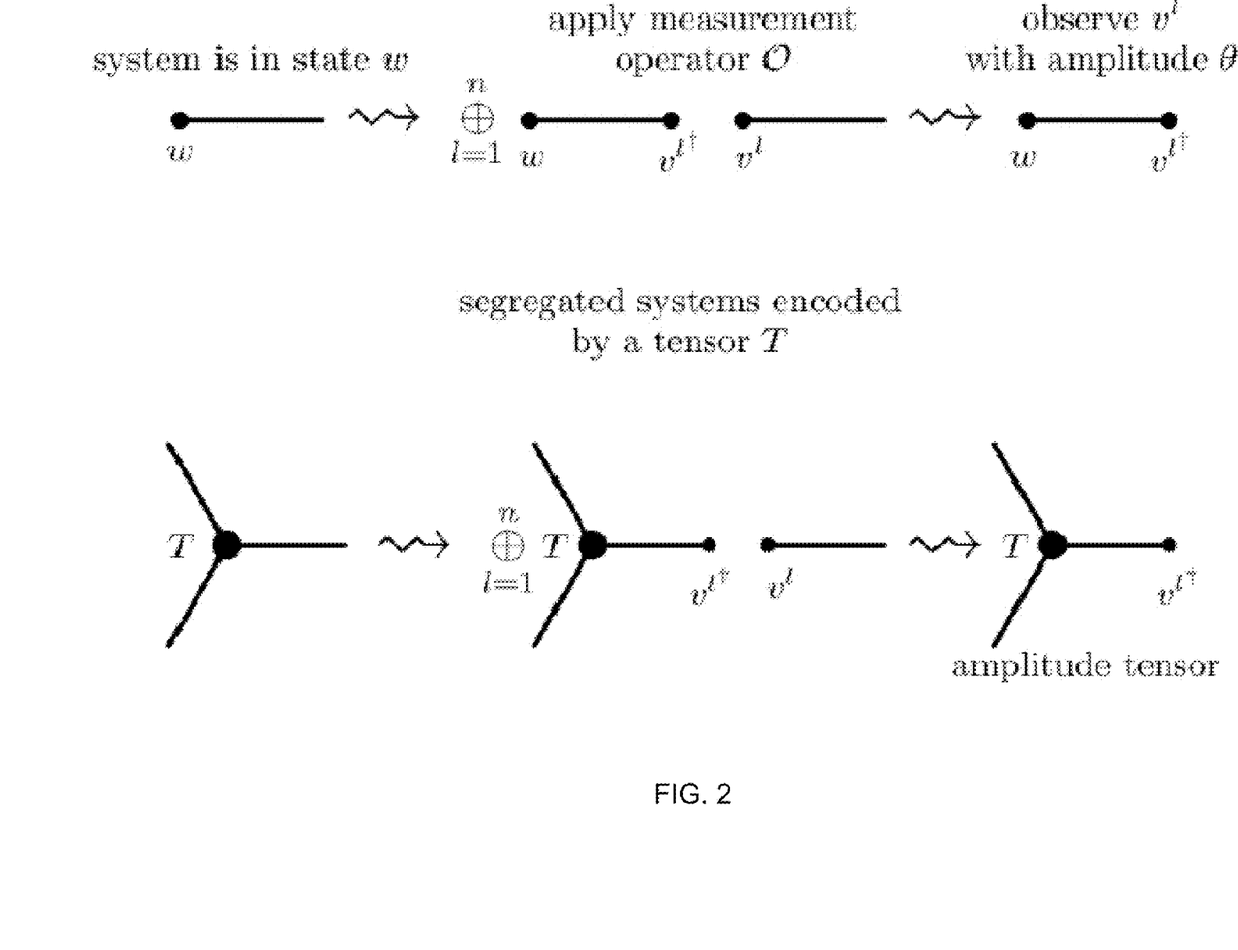
FIG. 2 depicts a measurement using tensor contraction.

Once the outcome of the measurement is observed, the system is in a tensor product state. Thus, measuring v (i.e., observing some $v^l$) can be written as the right most alternative depicted in FIG. 2. The final effect of an observed measurement is tensor contraction with the observed state.

Figure 3:
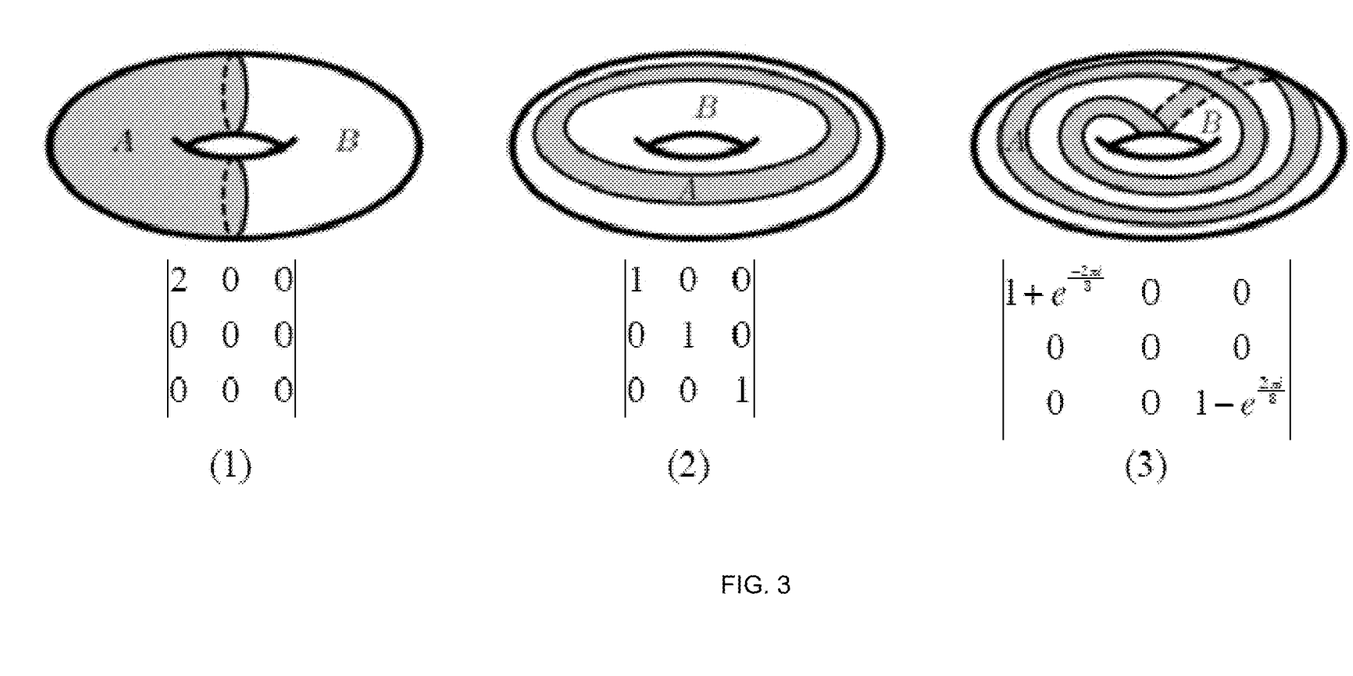
FIG. 3 depicts a (2+1)-dimensional TQFT.

The situation for a (2+1)-dimensional TQFT, as shown in FIG. 3, is only slightly more complicated. The 3-manifold M plays the role of the tensor T, but its valence is unspecified until the boundary of M is dissected into "pieces". These pieces may be closed or with boundary (and are not necessarily connected), and serve as the index set for the tensor. The axioms for TQFTs strongly restrict which tensors arise as the boundary decomposition of M is varied. As an example, take M to be a solid torus $S^1 \times D^2$ and the theory to be Ising.

Decomposing ∂M into A∪B in the following three ways yields three different matrices (2-tensors) in the 1, σ, ψ basis, along the loops A∩B.

These calculations may now be illustrated. Case (2) is axiomatic: products correspond to identity morphisms. The identity operator "glues up" to become the vector $v_l \in V_l(T^2)$, $$v_l = \frac{1}{D}(d_1, d_\sigma, d_\psi) = \left(\frac{1}{2}, \frac{\sqrt{2}}{2}, \frac{1}{2}\right)$$

in the longitudinal basis. Now transforming by S to the meridial basis we obtain $v_m = S(v_l) = (1,0,0) \in V_m$ and converting to an operator we should divide entries by $S_{l,i} = d_i/D$ to obtain case (1). Finally, to compute case (3) note that if $A = S^{-1}T^2S$ is the modular transformation sending (1) to (3), then in this twisted basis (t), v becomes $$v_t = \begin{vmatrix} \frac{1+\omega}{2} & 0 & \frac{1-\omega}{2} \\ 0 & 1 & 0 \\ \frac{1-\omega}{2} & 0 & \frac{1+\omega}{2} \end{vmatrix} \begin{pmatrix} 1 \\ 0 \\ 0 \end{pmatrix} = \begin{pmatrix} \frac{1+\omega}{2} \\ 0 \\ \frac{1-\omega}{2} \end{pmatrix}, \omega = e^{-2\pi i/8},$$

which converts to case (3).

We record also the vector and operator associated with a case (3'), the same boundary data as case (3) but with the solid torus containing a ψ-charge Wilson loop running along its core. In case (3')

$$v_t = \begin{vmatrix} \frac{1+\omega}{2} & 0 & \frac{1-\omega}{2} \\ 0 & 1 & 0 \\ \frac{1-\omega}{2} & 0 & \frac{1+\omega}{2} \end{vmatrix} \begin{pmatrix} 0 \\ 0 \\ 1 \end{pmatrix} = \begin{pmatrix} \frac{1-\omega}{2} \\ 0 \\ \frac{1+\omega}{2} \end{pmatrix},$$

and the corresponding operator is $$\begin{vmatrix} 1 - e^{2\pi i/8} & 0 & 0 \\ 0 & 0 & 0 \\ 0 & 0 & 1 + e^{2\pi i/8} \end{vmatrix}.$$

It is known that the operation of an interferometer within an Ising system using σ probe particles projects the topological charge state of the interferometry loop to a charge sector 1, σ, or ψ, along the interferometry loop γ up to an error exponentially small in the number of probes.

Figure 4:
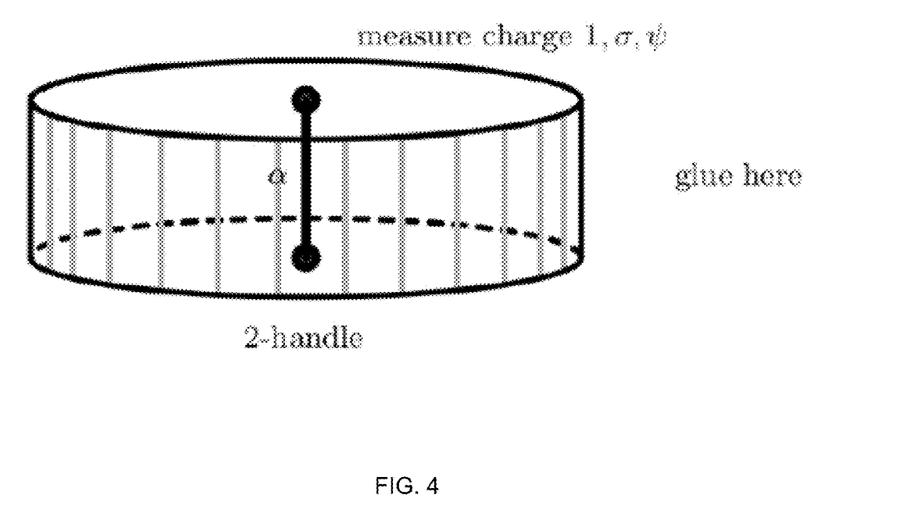
FIG. 4 depicts gluing a 2-handle of space-time topological fluid along a measured loop.
Figure 5:
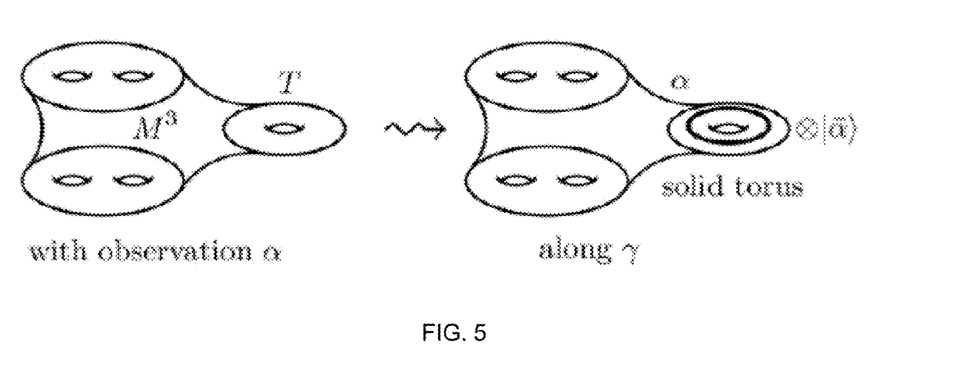
FIG. 5 depicts a measurement Dehn filling a solid torus.

The TQFT analog to partial trace ⟨⟩—— ⟨⟩—— is to glue a 2-handle of space-time topological fluid along the measured loop γ. As shown in FIG. 4, the α charge line at the core of the 2-handle is precisely the measurement outcome α=1, σ, ψ (so if the trivial particle is measured, the 2-handle has no Wilson line). Up to an overall scalar ($=S_{1\alpha}$) which has no physical significance, if γ is a loop on a torus boundary component T, we may glue not just a 2-handle but also a 3-handle ($B^3, \partial B^3$) as well (containing a matching charge line), so that measuring α along γ is equivalent to Dehn filling T with a solid torus $S^1 \times D^2$, $*\times \partial D^2$ gluing to γ and $S^1 \times *$ being a Wilson loop of charge α. The analogy with the Penrose TQFT: ⟨⟩—— ⟨⟩—— may now be completed. As shown in FIG. 5, a measurement Dehn fills a solid torus along γ with a Wilson loop of charge α at its core—and in a disjoint system, we have a state $|\bar{\alpha}|\bar{\alpha}\rangle$ recording the fact that α was the measurement outcome.

DETAILED DESCRIPTION OF ILLUSTRATIVE EMBODIMENTS

A CTS is any semiconductor/superconducting system resulting in a "generic (no special symmetries) 2D topological superconducting film with a single sheeted Dirac-like Fermi surface." Our terminology sometimes identifies such a state (called X) with the ISH which houses it, as in our co-pending U.S. patent application Ser. Nos. 12/979,778 and 12/979,856, the disclosures of which are incorporated herein by reference. As disclosed herein, three tunneling amplitudes, $t_1, t_2$, and $t_3$ may be sharply regulated (essentially turned "on" and "off") on a gigahertz time scale. This may be done either with 1) high speed electronic and/or magnetic top gates, 2) optically using laser pulses to disturb the ground state of X near a tunneling junction, effectively reducing the bulk gap Δ in this region and increasing the amplitude to tunnel (note that $t \approx e^{-const\sqrt{M\Delta}}$, where M is an effective mass, Δ the bulk gap, and L is the length of the summary tunneling junction,) or 3) any other electronic, optical, or magnetic intervention.

Figure 6A:
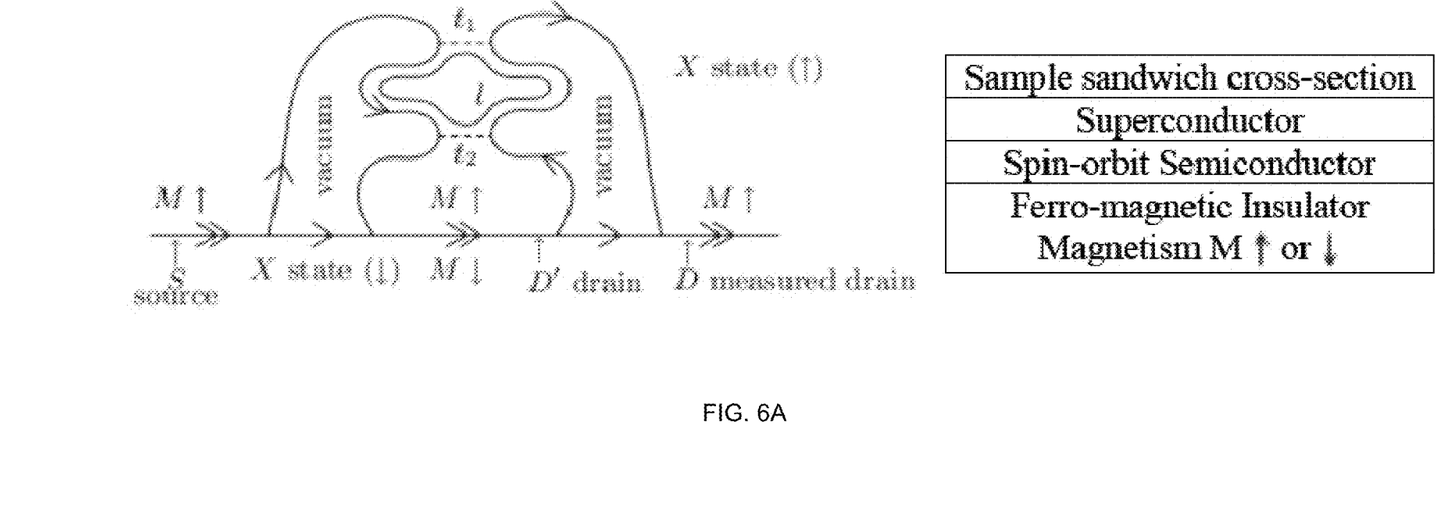
FIG. 6A provides a sketch of a Beenakker-style interferometer in the CTS-ISH context.
Figure 6B:
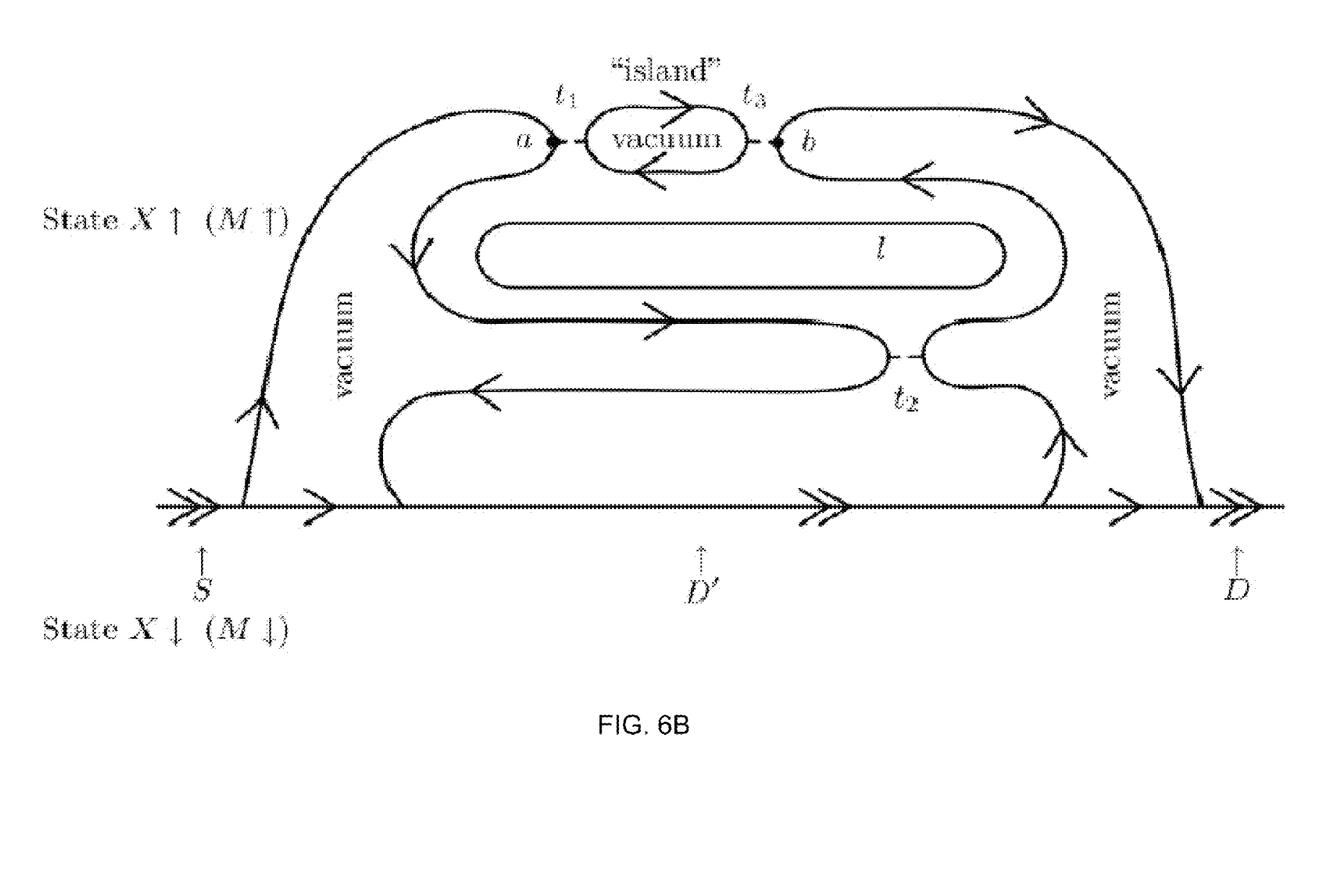
FIG. 6B depicts a twisted interferometer.

For reference and contrast, FIG. 6A provides a sketch of a Beenakker (arxiv:0903.2196) style interferometer in the CTS-ISH context. The dotted lines are tunneling junctions with amplitudes $t_1$ and $t_2$ respectively. The single arrows represent Majorana mode along edges, while the double arrow represents a Dirac mode. FIG. 6B depicts a twisted interferometer. The interferometry loop is labeled by l.

Note that, as used herein, "vacuum" is either an absence of the X-state fluid or a transformed fluid without non-Abelian properties. The "vacuum" is created by electronic and/or magnetic top gating. In FIG. 6B, the distance $L_1$ from a to b along the island (through tunneling junctions 1 and 3) should be approximately ⅕ the distance $L_2$ from a to b detouring the island and passing through tunneling junction 2. Tunneling is allowed at $t_1, t_2, t_3$ for an interval of time $\approx t_0/10$, where $t_0$ is the time for a wave packet to propagate once around the island at group velocity.

A voltage bias may be maintained between the source S and the drains D and D'. While the tunneling junctions 1, 2, and 3 are open, all current flows into D'. At time t=0, $t_1$ is made substantial for a brief time $\approx t_0/10$ (order $10^{-10}$–$10^{-9}$ seconds), allowing a wave packet of σ-particles with support small with respect to $L_1$ to transit to the island with amplitude $t_1$ while, with amplitude $\sqrt{1-t_1^2}$, the wave packet continues along the left edge. Knowing the geometry and the velocity of the edge mode, $t_2$ is briefly—again for a time $\approx t_0/10$—increased from zero precisely as this latter wave packet arrives at the second tunneling junction so that the packet is transmitted with amplitude $t_2$. Finally, the first wave packet branch arrives, after 2.5 trips around the island, precisely when the second wave packet branch also arrives at the third tunneling junction.

At this moment, $t_3$ is briefly made substantial (>0), and the two branches interfere. The nature of this interference, constructive or destructive, is detected at the drain D. The condition $L_2/L_1 \approx 5$ allows the two branches to arrive synchronously. In order to maintain superposition of trivial topological charge and a topological charge along the edge of the vacuum island, during the running of the twisted interferometer, a magnetic flux should be threaded through the vacuum island which is tuned to equalize the energies of these two states. This tuning does not need to be exponentially precise; its purpose is not precision of a computational state but rather maintenance of superposition during the 2.5 laps around the interferometer. Error in this tuning may reduce the twisted interferometer's visibility algebraically.

Up to errors exponentially small in the number of Ising σ-particles admitted to the island, the twisted interferometer acts on the topological charge enclosed within the interferometry loop by either $$\begin{vmatrix} 1+\omega & 0 \\ 0 & 1-\omega \end{vmatrix} \text{ or } \begin{vmatrix} 1-\omega & 0 \\ 0 & 1+\omega \end{vmatrix}$$

in the longitudinal $\{|1\rangle, |\psi\rangle\}$ basis according to whether $|1\rangle$ or $|\psi\rangle$ is observed, where $\omega = e^{-\pi l/4}$.

In the untwisted (Beenakker) context, the measurement is in the basis of topological charge $\{|1\rangle, |\psi\rangle\}$ enclosed in the untwisted interferometry loop 1 (FIG. 6A). The operator O is the sum of the two basis projectors tensored with the measurement outcome $$O \equiv \begin{vmatrix} 1 & 0 \\ 0 & 0 \end{vmatrix} \otimes |1\rangle + \begin{vmatrix} 0 & 0 \\ 0 & 1 \end{vmatrix} \otimes |\psi\rangle,$$

or less formally, $$P_1 = \begin{vmatrix} 1 & 0 \\ 0 & 0 \end{vmatrix}$$

if $|1\rangle$ is observed and $$P_2 = \begin{vmatrix} 0 & 0 \\ 0 & 1 \end{vmatrix}$$

if $|\psi\rangle$ is observed. One might expect in the twisted context to affect conjugates of $P_1, P_2$—accounting for a change of basis from an untwisted to a twisted interferometry loop. However, it is immediate that if no charge lines enter or leave the twisted interferometer (and we always assume there are no mobile charges) that $O_t = O_{twisted}$ must be diagonal in the basis $\{|1\rangle, |\psi\rangle\}$ of topological charge.

As described above, making a charge measurement with trivial outcome is equivalent to topologically Dehn filling the twisted interferometry loop γ with a solid torus $S^1 \times D^2$ of pure topological ground state medium; whereas outcome $|\psi\rangle$ is equivalent to Dehn filling along γ a solid torus with a ψ-charge loop (Wilson line loop) along the core circle $S^1 \times 0 \subset S^1 \times D^2$.

In terms of operators in twisted annular $\{1, \psi\}$ basis, we have:

$$O_t |_{|1\rangle} = \begin{vmatrix} 1+\omega & 0 \\ 0 & 1-\omega \end{vmatrix} (1+\omega)|1\rangle\langle 1| + (1-\omega)|\psi\rangle\langle\psi|$$

if $|1\rangle$ is measured, and $$O_t |_{|\psi\rangle} = \begin{vmatrix} 1-\omega & 0 \\ 0 & 1+\omega \end{vmatrix} (1-\omega)|1\rangle\langle 1| + (1+\omega)|\psi\rangle\langle\psi|$$

if $|\psi\rangle$ is measured.

Figure 7A:
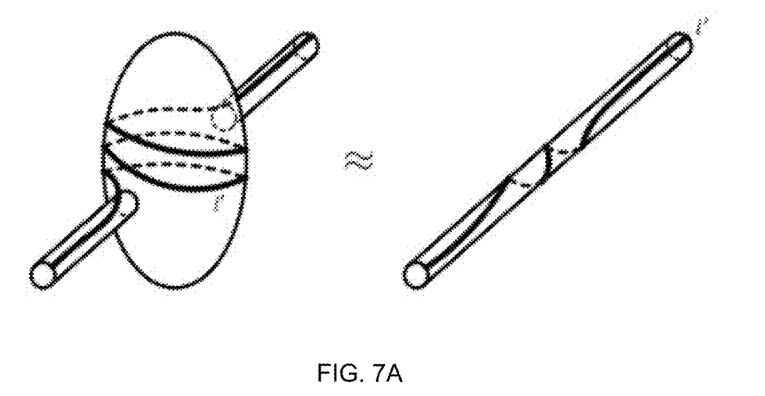
FIGS. 7A and 7B illustrate computation of operators in a twisted annular basis.
Figure 7B:
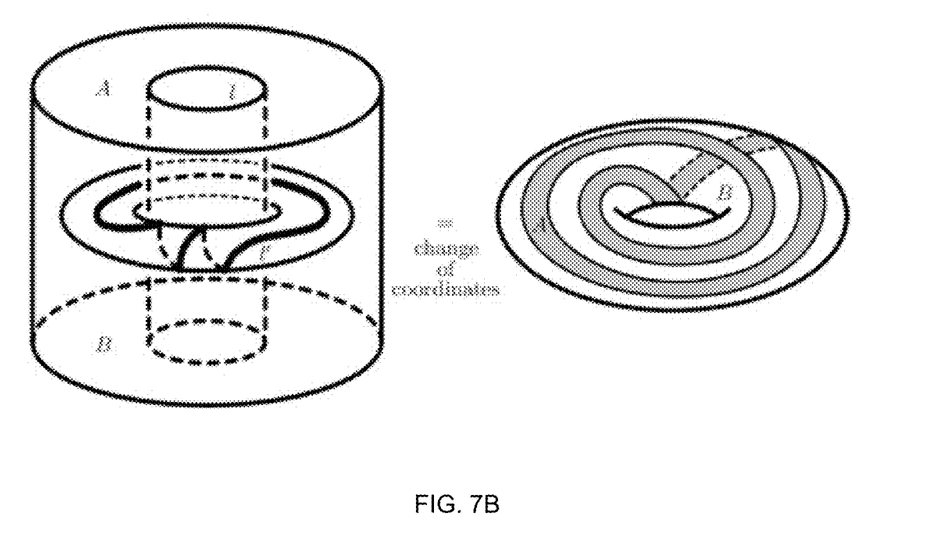

In FIG. 7A, the two extra trips around the island mean that measurement is affected along a topologically twisted "(1,−2)" loop (using meridian, longitude basis) which is related to the spatial perimeter of the interferometer 1 in FIGS. 6A and 6B, i.e., the usual interference loop, by a $A:= S^{-1}T^2S$ change of coordinates. Referring to FIGS. 7A and 7B, it can be seen that the computation provided above computes $O_t$.

Twisted interferometry employs a single burst of n co-propagating probe particles (σ's in the Ising theory (CTS)) which form a wave packet. A reasonable estimate for n to be large enough both to converge the interferometer and to tunnel onto the vacuum island in $10^{-10}$ seconds is $10 \leq n \leq 100$. The σ probes follow trajectories mutually twisting $-4\pi$ and linking each other (linking number=−2) as they make two (clockwise) circuits around the vacuum island. Measurement of current into the drain D can be compared with standard interferometric calculation to yield a topological charge of either $|1\rangle$ or $|\psi\rangle$ along the (−2,1) interferometric loop.

Ball park estimates for ISH Majorana edge mode velocities are $10^4$ m/s. If $L_1 = 5$ μm and the wave packet is to have most of its amplitude supported along a 1 μm length with exponentially decaying tails, then the tunneling junction should be open for $10^{-10}$ s. For reasonable tunneling currents, this would permit between 10 and 100 σ's to tunnel, adequate to effectively converge the interferometer.

Figure 8:
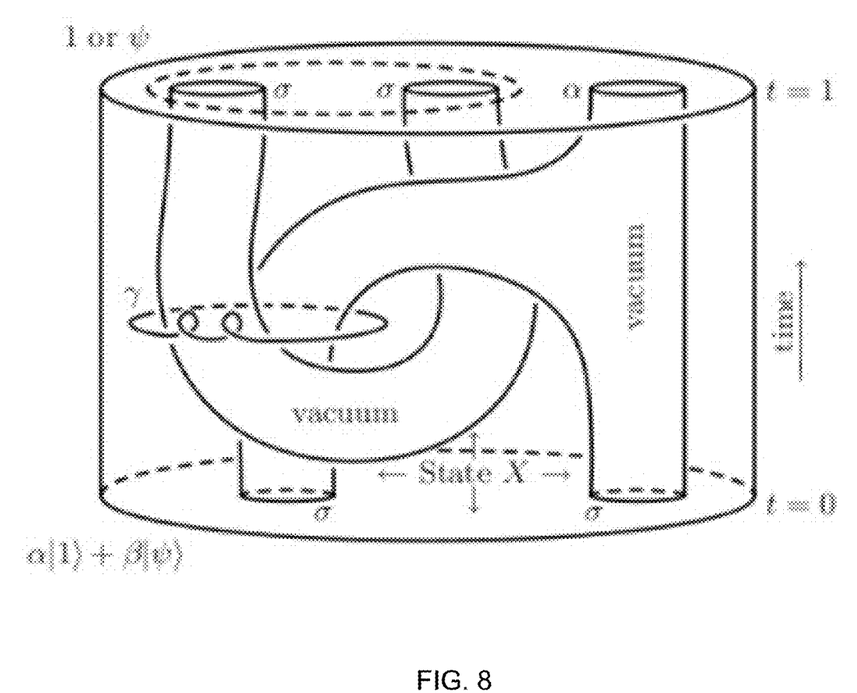
FIG. 8 summarizes a protocol producing a topologically protected π/8-gate using twisted interferometry.

FIG. 8 summarizes a protocol producing a topologically protected π/8-gate using twisted interferometry. FIG. 8 depicts a 1 or ψ-qubit evolved in time. The first event is the creation of a new dot of vacuum (the local minima). At the saddle point, this dot of vacuum splits into two dots of vacuum, each with topological charge σ. Third, twisted interferometry is performed along γ. Note that γ should not be read as a Wilson loop in FIG. 8, but rather as our notation for twisted interferometry.

The fourth event is a fusion of the σ-charged dots of the original qubit. The fifth and final event is charge measurement along α. The charge α at the top can be measured to be 1 or ψ by ordinary (previously described) Beenakker quasi-particle interferometry. Twisted interferometry is used to measure the charge around γ (≡l' in earlier notation) with the twists recorded by the two kinks in γ corresponding to the two loops around the island of vacuum in FIG. 6B. This yields either states A(1) or A(ψ) via projective measurement. Using techniques of quantum topology, we will verify that the initial α|1⟩+β|ψ⟩ is transformed by the matrix following "outcomes" in the four measurement cases:

| Charge γ | | Charge α | Outcome | Correct by |
|---|---|---|---|---|
| A(1) | ⊗ | A(1) | $\begin{vmatrix} 1 & 0 \\ 0 & e^{\frac{2\pi i}{8}} \end{vmatrix}$ | $\begin{vmatrix} 1 & 0 \\ 0 & 1 \end{vmatrix}$ |
| A(1) | ⊗ | A(ψ) | $\begin{vmatrix} e^{\frac{2\pi i}{8}} & 0 \\ 0 & 1 \end{vmatrix}$ | $\begin{vmatrix} 1 & 0 \\ 0 & i \end{vmatrix}$ |
| A(ψ) | ⊗ | A(1) | $\begin{vmatrix} -1 & 0 \\ 0 & e^{\frac{2\pi i}{8}} \end{vmatrix}$ | $\begin{vmatrix} 1 & 0 \\ 0 & -1 \end{vmatrix}$ |
| A(ψ) | ⊗ | A(ψ) | $\begin{vmatrix} -e^{\frac{2\pi i}{8}} & 0 \\ 0 & 1 \end{vmatrix}$ | $\begin{vmatrix} 1 & 0 \\ 0 & -i \end{vmatrix}$ |

In all four cases, available transformations (as described above), listed in the right-most column above, convert the gate executed in FIG. 8 to the desired π/8-gate (up to an irrelevant overall phase).

Figure 9A:
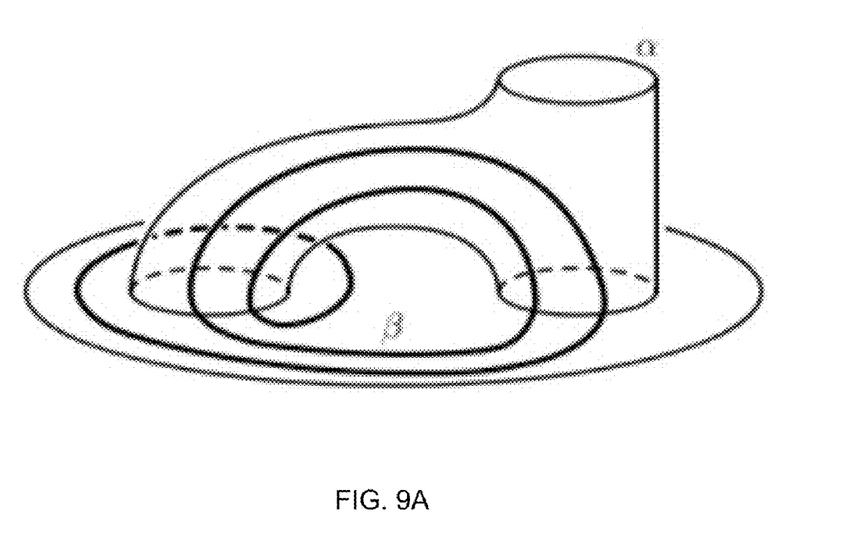
FIGS. 9A and 9B illustrate how a π/8-gate may be obtained.

Freedman, Nayak, and Walker (arxiv: 0512.072 and 0512.066) and our U.S. patent application Ser. Nos. 12/979,778 and 12/979,856, show that the π/8-gate may be obtained by cutting along β in FIG. 9A if α=1 (and its inverse if α=ψ). Thickening the surface in FIG. 9A results in FIG. 9B. Now the framed curve γ in FIG. 9A is precisely the surgery required to send β to the meridian μ labeled in FIG. 9B. Measuring 1 along γ affects ordinary framed surgery, while measuring ψ affects an easily computed variant, "defective surgery," which is correctable to ordinary surgery as above, by the action of one or two braid generators. The matrices in the table above give precise outcomes according to the two measurements.

Figure 9B:
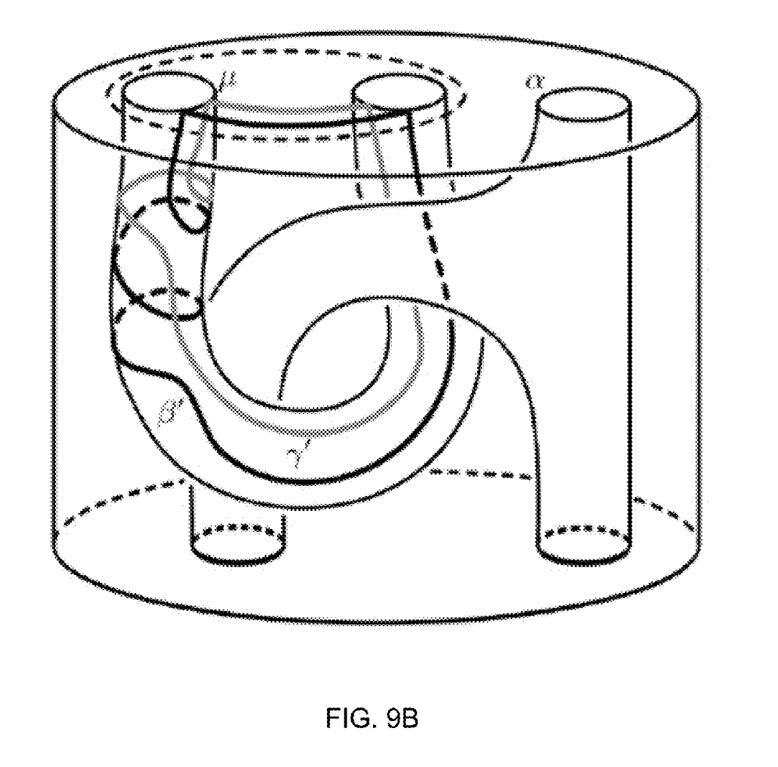

Since the original qubit has σ charges on its internal punctures, there will be a σ-charge on β, but compared to the original qubit at time t=0, the relative phase between the two fusion channels 1 and ψ is now changed by $e^{2\pi i/8}$. The loop β' in FIG. 9B is simply a copy of β transported across the product structure.

A (−1) Dehn twist on the loop γ' throws β' to the meridian μ. Thus Dehn filling on a bulk parallel to γ', with a (−1) additional twist in its framing compared to the normal framing γ' inherits from the boundary of the bulk, effectively endows the bulk with a new product structure in which β is connected by a cylinder to μ. γ, as drawn in FIG. 8, is this (−1) framed bulk loop isotopic to γ'. Thus twisted interferometry with |1⟩ as outcome "teleports" the twist and non-time-slice qubit determined by cutting the surface of FIG. 9A along β to an untwisted time-slice qubit at the top of FIG. 9B (within the dotted circle).

It remains to compute the effect of twisted interferometry if the outcome is |ψ⟩. |σ⟩ is not a possible outcome as the charge along γ=l'=(1,2) is obtained from the charge along l by applying the matrix A. A does not mix the |σ⟩ and the {|1⟩,|ψ⟩} sectors and the charge along l=α|1⟩+β|ψ⟩.) The effect of outcome |ψ⟩ is a Wilson loop of charge |ψ⟩ parallel to γ' (in the bulk) with no additional twist in its framing.

Figure 10A:
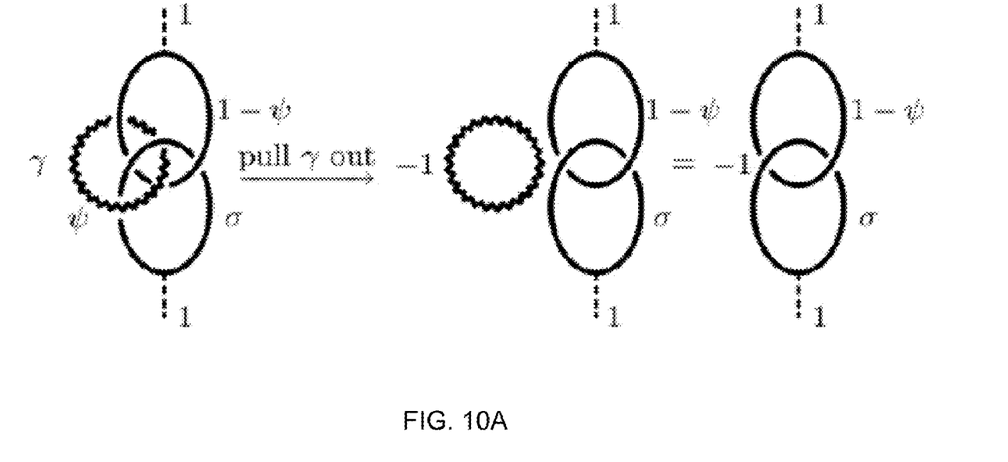
FIGS. 10A and 10B show Wilson loops in relation to charge lines corresponding to an original qubit in various states.
Figure 10B:
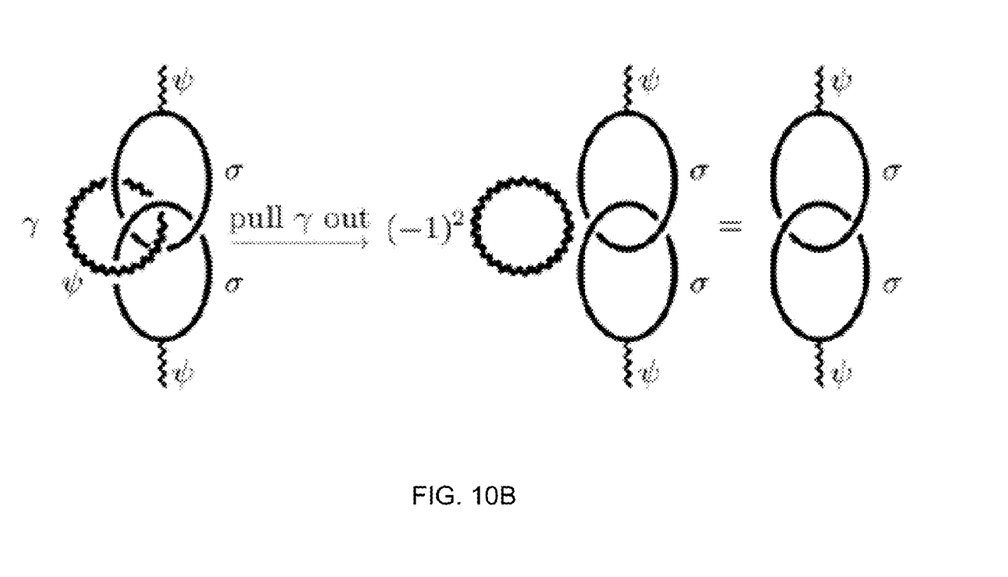

Using the calculational tools of modular tensor categories (MTC), FIG. 10A shows the Wilson loop "γ" in relation to the charge lines corresponding to the original qubit in state |1⟩, and FIG. 10B shows the configuration with the original qubit in state |ψ⟩. It is evident that measuring |ψ⟩ is equivalent to the action of $$\begin{vmatrix} -1 & 0 \\ 0 & 1 \end{vmatrix}$$

which, up to an overall phase, is the square of a braid generator.

Example Computing Environment

Figure 11:
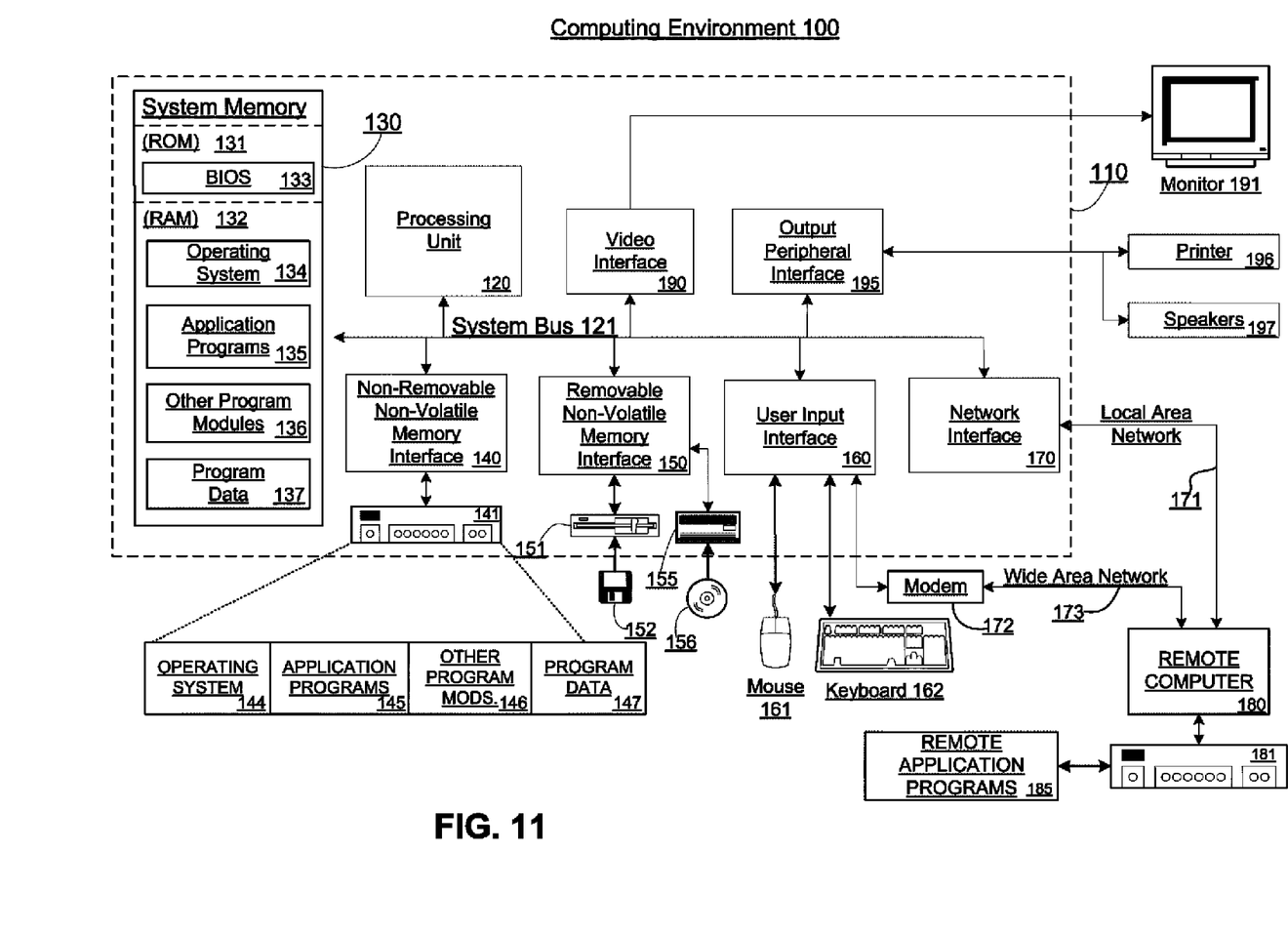
FIG. 11 shows an example computing environment in which example embodiments and aspects may be implemented.

FIG. 11 shows an example computing environment in which example embodiments and aspects may be implemented. The computing system environment 100 is only one example of a suitable computing environment and is not intended to suggest any limitation as to the scope of use or functionality. Neither should the computing environment 100 be interpreted as having any dependency or requirement relating to any one or combination of components illustrated in the exemplary operating environment 100.

Numerous other general purpose or special purpose computing system environments or configurations may be used. Examples of well known computing systems, environments, and/or configurations that may be suitable for use include, but are not limited to, personal computers, server computers, hand-held or laptop devices, multiprocessor systems, microprocessor-based systems, set top boxes, programmable consumer electronics, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 11, an exemplary system includes a general purpose computing device in the form of a computer 110. Components of computer 110 may include, but are not limited to, a processing unit 120, a system memory 130, and a system bus 121 that couples various system components including the system memory to the processing unit 120. The processing unit 120 may represent multiple logical processing units such as those supported on a multi-threaded processor. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus). The system bus 121 may also be implemented as a point-to-point connection, switching fabric, or the like, among the communicating devices.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 11 illustrates operating system 134, application programs 135, other program modules 136, and program data 137.

The computer 110 may also include other removable/non-removable, volatile/nonvolatile computer storage media. By way of example only, FIG. 11 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 11, provide storage of computer readable instructions, data structures, program modules and other data for the computer 110. In FIG. 11, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 11. The logical connections depicted in FIG. 11 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 11 illustrates remote application programs 185 as residing on memory device 181. It will be appreciated that the network connections shown are exemplary and other means of establishing a communications link between the computers may be used.

What is claimed:

1. A twisted interferometer, comprising:
a source, a first drain, and a second drain;
a first tunneling path between a first vacuum and a second vacuum;
a second tunneling path between the first vacuum and a third vacuum; and
a third tunneling path between the second vacuum and the third vacuum,
wherein a voltage bias is maintained between the source and the drains such that a current flows around edges of the vacuums.

2. The interferometer of claim 1, wherein each of the vacuums is an absence of X-state fluid or a transformed fluid without non-Abelian properties, and the vacuum is created by electronic or magnetic top gating.

3. The interferometer of claim 1, wherein a first distance through the first and third tunneling paths between a first point on an edge of the first vacuum and a third point on an edge of the third vacuum is approximately $\frac{1}{5}$ of a second distance through the second tunneling path between the first point and the third point.

4. The interferometer of claim 3, wherein the first distance is measured around an edge of the second vacuum, and the second distance is measured around an edge of the first vacuum and an edge of the third vacuum.

5. The interferometer of claim 1, wherein tunneling is allowed at each of the tunneling paths for an interval of time that is proportional to the time for a wave packet to propagate once around the second vacuum at group velocity.

6. The interferometer of claim 1, wherein, while the first, second, and third tunneling junctions are open, all current flows into the first drain.

7. The interferometer of claim 1, wherein a wave packet of σ-particles with support small with respect to the first distance is allowed to transit to the second vacuum with a first amplitude.

8. The interferometer of claim 7, wherein the wave packet is allowed to transit the first vacuum with a second amplitude that is smaller than the first amplitude.

9. The interferometer of claim 8, wherein a second wave packet arrives at the second tunneling junction such that the packet is transmitted with a third amplitude.

10. The interferometer of claim 9, wherein the first wave packet arrives at the third tunneling junction precisely when the second wave packet also arrives at the third tunneling junction.

11. The interferometer of claim 10, wherein the first wave packet arrives at the third tunneling junction after 2.5 trips around the second vacuum.

12. The interferometer of claim 11, wherein the third tunneling path is briefly made substantial such that the two wave packets interfere.

13. The interferometer of claim 12, wherein the nature of the interference is detected at the second drain.

14. A planar $\pi/8$-gate in a chiral topological superconductor, comprising a low mobility electronic structure comprising a spin-orbit coupled semiconductor, an ordinary superconductor, a ferro-magnetic insulator or a ferri-magnetic insulator.

15. The gate of claim 14, wherein the electronic structure is capable of supporting universal topological, fault tolerant quantum computation.

16. A topologically protected method for implementing a $\pi/8$-gate in a chiral-topological-superconductor (CTS), Ising-sandwich-heterostructure (ISH) device, the method comprising:
implementing universal quantum computation in a topologically protected, fault-tolerant manner within the CTS-ISH device.

17. The method of claim 16, wherein the CTS-ISH device comprises a low mobility electronic structure that is capable of supporting universal topological, fault tolerant quantum computation.

18. The method of claim 17, wherein the low mobility electronic structure comprises a spin-orbit coupled semiconductor.

19. The method of claim 17, wherein the low mobility electronic structure comprises an ordinary superconductor.

20. The method of claim 17, wherein the low mobility electronic structure comprises a ferro- or ferri-magnetic insulator.

* * * * *